United States Patent
Magaña

(10) Patent No.: US 9,620,023 B2
(45) Date of Patent: Apr. 11, 2017

(54) METHOD FOR MODELING AIRCRAFT PERFORMANCE THROUGH ADAPTIVE AIRCRAFT PERFORMANCE MODELS

(71) Applicant: The Boeing Company, Chicago, IL (US)

(72) Inventor: Enrique Juan Casado Magaña, Madrid (ES)

(73) Assignee: The Boeing Company, Chicago, IL (US)

( * ) Notice: Subject to any disclaimer, the term of this patent is extended or adjusted under 35 U.S.C. 154(b) by 100 days.

(21) Appl. No.: 14/525,418

(22) Filed: Oct. 28, 2014

(65) Prior Publication Data
US 2015/0210405 A1     Jul. 30, 2015

(30) Foreign Application Priority Data
Jan. 30, 2014  (EP) .................................... 14382028

(51) Int. Cl.
G08G 5/00    (2006.01)
B64F 5/00    (2006.01)
G06F 17/50   (2006.01)

(52) U.S. Cl.
CPC ......... G08G 5/0052 (2013.01); G08G 5/0017 (2013.01); *G06F 17/50* (2013.01); *G06F 17/5009* (2013.01)

(58) Field of Classification Search
CPC .... G08G 5/0017; G08G 5/003–5/0039; G08G 5/0043; G08G 5/0047–5/0069;
(Continued)

(56) References Cited

U.S. PATENT DOCUMENTS

2007/0282766 A1* 12/2007 Hartman .............. G05B 13/048
                                                  706/15
2008/0234994 A1    9/2008 Goebel et al.
(Continued)

OTHER PUBLICATIONS

Krozel et al., "Intent Inference with Path Prediction", Journal of Guidance, Control, and Dynamics, vol. 29, No. 2, Mar.-Apr. 2006, pp. 225-236.*
(Continued)

*Primary Examiner* — Adam Mott
(74) *Attorney, Agent, or Firm* — Walters & Wasylyna LLC

(57) ABSTRACT

A method for modeling aircraft performance including (a) introducing aircraft degradation coefficients in a nominal aircraft performance model of an aircraft and obtaining a degraded aircraft performance model, (b) calculating computed trajectory data in a trajectory computation infrastructure using as inputs aircraft intent which represents trajectory data, weather data, and the degraded aircraft performance model; (c) comparing the trajectory data with the computed trajectory data; (d) obtaining an enhanced aircraft performance model by considering the degraded aircraft performance model as the enhanced aircraft performance model, when the result of the comparison is less than a previously established threshold; and (e) modifying, when the result of the comparison is higher than the previously established threshold, the aircraft degradation coefficients and executing steps (a) to (e) of the method, until the result of the comparison is less than the previously established threshold.

13 Claims, 1 Drawing Sheet

(58) Field of Classification Search
CPC .. G06F 17/50; G06F 17/5095; G06F 17/5009; B64C 19/00; G06Q 10/04; G06Q 10/06; G06Q 50/30
See application file for complete search history.

(56) References Cited

U.S. PATENT DOCUMENTS

| | | |
|---|---|---|
| 2012/0116614 A1 | 5/2012 | Torres et al. |
| 2012/0245834 A1* | 9/2012 | Klooster ............. G08G 5/0039 701/120 |
| 2014/0005861 A1* | 1/2014 | Mere ................... G08G 5/0039 701/3 |

OTHER PUBLICATIONS

Extended European Search Report, EP 14 38 2028 (2014).
Vilaplana et al., "Towards a Formal Language for the Common Description of Aircraft Intent," *Digital Avionics Systems Conference* (2005).
Barker, "Aircraft Performance Monitoring," *Regional Seminar, Presented by Steve Barker, Senior Performance Engineer, Airbus* (Apr. 2013).
Nuic et al., "BADA: An advanced aircraft performance model for present and future ATM systems," *International Journal of Adaptive Control and Signal Processing*, vol. 24, No. 10 (2010).
"Guidance Material and Best Practices for Fuel and Environmental Management," International Air Transport Association (IATA), 3rd Edition (2008).
Foueri, "Aircraft Performance Degradation," 16th Performance and Operations Conference (May 2009).

* cited by examiner

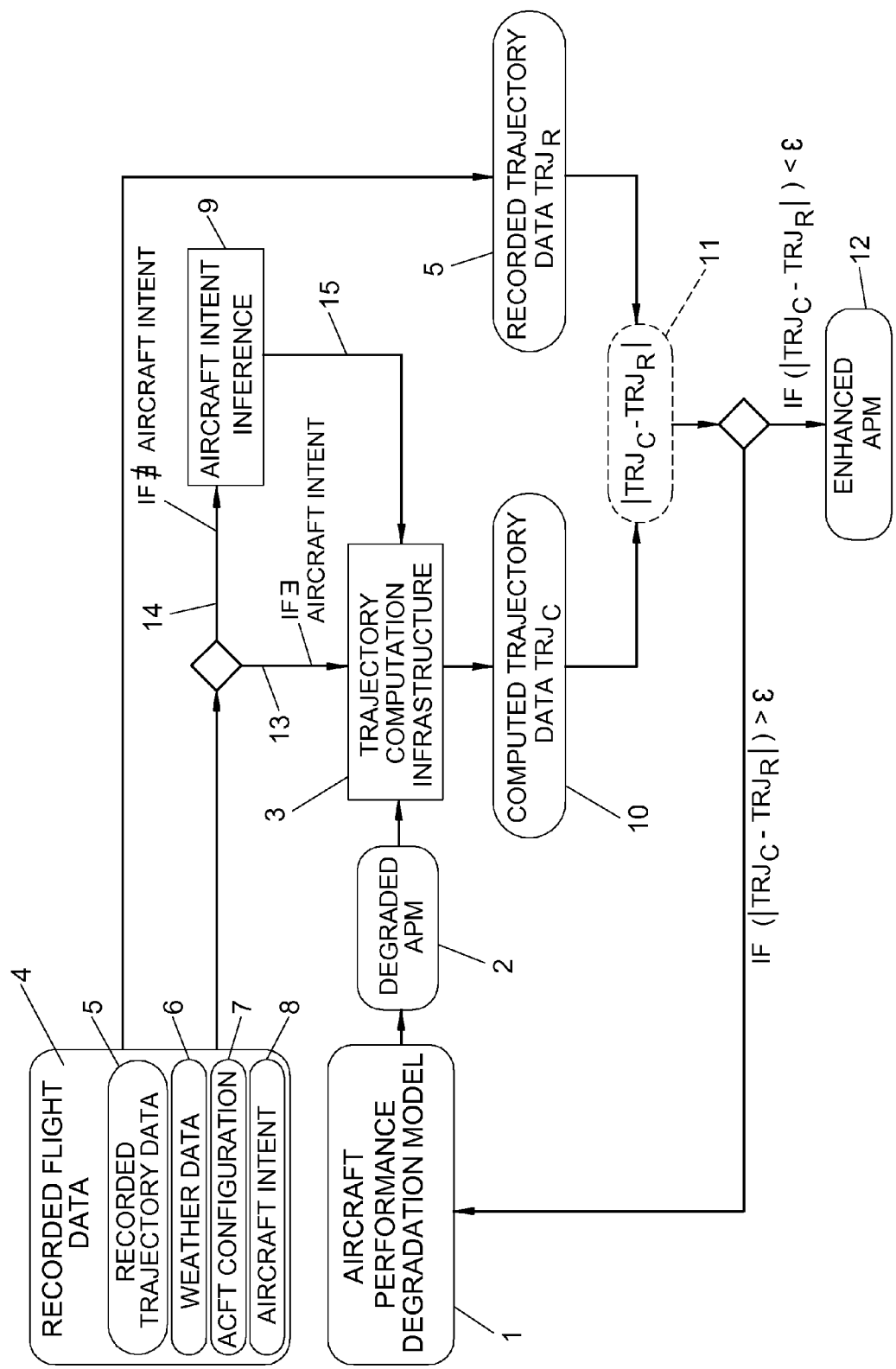

METHOD FOR MODELING AIRCRAFT PERFORMANCE THROUGH ADAPTIVE AIRCRAFT PERFORMANCE MODELS

PRIORITY

This application claims priority from European Patent Application No. EP14382028.0 filed on Jan. 30, 2014.

FIELD

This application relates to a method for improving the fidelity of aircraft performance models (APMs) used by aircraft trajectory predictors and air traffic simulators in Air Traffic Management (ATM).

BACKGROUND

Advanced trajectory modeling and traffic simulation capabilities require high fidelity aircraft performance models (APMs), which usually are generic representations of the nominal aircraft performance. A main need, both in the current and future Air Traffic Management (ATM) paradigms, is to have highly accurate aircraft trajectory predictions computed on-ground. The widely accepted models used by the ATM community are the Eurocontrol BADA (Base of Aircraft Data) models.

BADA enables aircraft trajectory modeling in support of, among others, the following applications: (1) Air traffic simulation for operations analysis and Air Traffic Control (ATC) training; (2) Research and validation of new ATM concepts, tools and equipment before they are introduced into operational service; (3) Trajectory prediction for ground-based ATM systems (e.g., Flight Data Processing Systems); (4) Environmental assessment of air traffic operations (e.g., impact of noise and emissions).

BADA is made up of two main components: the model specification and the datasets. The model specification consists of a set of polynomial expressions used to calculate aircraft performance parameters, such as the drag coefficient, fuel consumption, engine thrust, etc. The polynomials are parameterized by a set of coefficients that particularize the polynomial expressions for specific aircraft types. These coefficients are the BADA datasets. Each aircraft type (airframe-engine combination) has associated therewith a specific BADA dataset. The BADA dataset of an aircraft type used in conjunction with the BADA model specification provide approximate values of the aircraft performance characteristics (e.g., drag polar, thrust coefficient, fuel consumption, etc.) of that aircraft.

However, these models lack information about aircraft performance degradation and, therefore, should be considered as generic representations of the average nominal aircraft performance of the aircraft based on manufacturers' information. Hence, potential improvements of the aircraft performance models are possible if data from real operations are available to the ground-based infrastructure. Taking advantage of the BADA model specifications, it would be possible to improve the datasets by updating the datasets using operational data of aircraft of the same type operating in a given environment by applying the proposed methodology.

The most accurate and up-to-date information about real aircraft performance is only available onboard. The Flight Management System (FMS) makes use of this information when commanding and controlling the aircraft. However, this information is not known by the Decision Support Tools (DST) supporting the standard operations. This information can only be accessed off-board by the airlines during the maintenance procedures (download of recorded flight data and health monitoring information).

Currently, there are no alternatives to using generic nominal APMs, such as BADA models, for representing the performance of the whole fleet of same-type aircraft. Those models have been widely accepted by the ATM community as the best representation of the performance of the majority of commercial aircrafts.

Further to the degradation suffered by the aircraft, document "Aircraft Performance Degradation" (M. Foueri 16th Performance and Operations Conference, May 2009) describes the influence of the engine degradation and the aerodynamic degradation over the optimal operational values of the aircraft performance. The degradation of aircraft performance admissible by the users is of course not unlimited. An example of how engine and aerodynamic degradation increase the fuel consumption and therefore decrease the efficiency of an aircraft is disclosed in document "Guidance Material and Best Practices for Fuel and Environmental Management" (International Air Transport Association (IATA), 3rd Edition, 2008). Airlines establish a detailed maintenance program for each individual aircraft in order to maintain its performance as closest as possible to the optimal operational values. When performance decreases below certain threshold, the maintenance procedures define how to proceed for recovering the optimal behavior. For example, for every 3,000 hours of flight time or 1,000 cycles, new airplanes lose about 1% of efficiency and after a few years of operation, the fuel burn tends to stabilize at 5% to 7% above the new aircraft performance levels. The extra fuel consumption can, therefore, be imputed to an increase of drag values and a decrease of thrust provided by the engine at same regimes, although more sophisticated approaches could also be valid.

SUMMARY

In one embodiment, disclosed is a method for modeling aircraft performance through adaptive aircraft performance models using aircraft performance data, wherein the aircraft performance data at least includes recorded trajectory data of the aircraft, weather data faced during trajectory of the aircraft, aircraft configuration data and an aircraft intent. The method may include the steps of (a) introducing aircraft degradation coefficients in a nominal aircraft performance model of the aircraft to obtain a degraded aircraft performance model; (b) calculating computed trajectory data in a trajectory computation infrastructure using as inputs the aircraft intent that represents the trajectory data, the weather data, and the degraded aircraft performance model; (c) comparing the recorded trajectory data with the computed trajectory data; (d) when the result of the comparison is less than a previously established threshold, obtaining an enhanced aircraft performance model by considering the degraded aircraft performance model as the enhanced aircraft performance model; and (e) when the result of the comparison is higher than the previously established threshold, modifying the aircraft degradation coefficients and executing steps (a) to (e) of the method until the result of the comparison is less than the previously established threshold.

Other embodiments of the disclosed method for modeling aircraft performance through adaptive aircraft performance models will become apparent from the following detailed description, the accompanying drawing and the appended claims.

BRIEF DESCRIPTION OF THE DRAWING

FIG. 1 is a flow diagram depicting one embodiment of the disclosed method for modeling aircraft performance through adaptive aircraft performance models.

DETAILED DESCRIPTION

Disclosed is a method for improving the fidelity of aircraft performance models (APM) based on the use of recorded flight data to identify statistically significant deviations between the actual performance of an aircraft in operational flight and the nominal performance values provided by the nominal APM for that aircraft type. The method may provide a more realistic APM based on theoretical assumptions about performance degradation and on the use of recorded flight data.

Although the enhanced APM may improve the predictability of advanced automation tools required for supporting the Trajectory Based Operations (TBO) concept upon which the future Air Traffic Management (ATM) system will rely, it may be possible to obtain short-term predictability improvements applying this method to the models used by current prediction and traffic simulation infrastructures.

The disclosed method for modeling aircraft performance through adaptive aircraft performance models may use actual flight recorded data. The data may at least include information about the aircraft state variables throughout the flight, data indicative of the weather faced during flight by the aircraft, and aircraft configuration data. Other information (aircraft intent) related to how the aircraft has been operated (e.g., the command and control instructions issued by the pilot or the FMS) may also be used.

In one embodiment, the disclosed method may include the step of identifying coefficients in a nominal polynomial aircraft performance model of the aircraft that will be modeled in order to represent the degradation in performance. Therefore, the degraded APM may be a polynomial description of the aircraft performance, including the degradation effects described by the APDM (Aircraft Performance Degradation Model). The APDM may be a selection criteria used for perturbing the elements of the APM, which will represent the degradation in performance in accordance with the established hypothesis. The hypotheses provided by the APDM may be translated to the coefficients that describe the nominal APMs (e.g., BADA Models).

The disclosed method may further include the step of calculating a computed trajectory using as inputs the aircraft intent (representation of a flown trajectory), the actual weather data faced during the trajectory, and the degraded aircraft performance model, which best fits the actual performance.

The disclosed method may further include the step of comparing the computed trajectory data with the recorded trajectory data. The comparison may focus on the absolute value of the difference between the computed trajectory data and the recorded trajectory data.

The disclosed method may further include the step of obtaining an enhanced aircraft performance model by considering the degraded aircraft performance model, when the result of the comparison is less than a previously established threshold. The recorded trajectory data may be information about real flights recorded by each Flight Data Recorder System (FDRS) onboard. The computed trajectory data may be calculated using a trajectory computation infrastructure that may be a computational infrastructure required for calculating an aircraft trajectory based on the set of required inputs (Aircraft Intent, Weather Model, Initial Conditions and APM). The threshold may be established by considering the model that would result in a minor average error in the measure of the mass of an aircraft during the complete trajectory of the aircraft, or any other similar criteria.

The disclosed method may further include the step of modifying, when the result of the comparison between the computed trajectory data and the recorded trajectory data is higher than the previously established threshold, the aircraft degradation coefficients. Once the coefficients have been modified, the steps of the disclosed method may be repeatedly executed until the result of the comparison is less than the previously established threshold.

In one particular embodiment, the aircraft degradation coefficients may be modeled by worsening the coefficients that instantiate the polynomial description of the aircraft performance. The main reasons for appearing performance degradation in an aircraft may be twofold: airframe deterioration due to deformed aerodynamic surfaces, seals missing or damaged, chipped paint or doors not flush or leaking; and engine ageing due to fan blade leading edge erosion, blended blades or nacelle air leakage. The influence of the engine degradation may be much higher (approximately 80%) than the influence of the aerodynamic degradation (approximately 20%) above the optimal operational values of the aircraft performance. Therefore, engine behavior may be the key element for maintaining the performance within the optimal operational values. The APDM may relate the extra fuel consumption with the polynomial description of the drag polar curve and the engine thrust curve. This is a model that represents how the performance degrades with time and operations.

In another embodiment, the aircraft degradation coefficients that instantiate the polynomial description of the aircraft performance may be coefficients of drag polar, engine thrust and fuel consumption of the aircraft.

In another embodiment, when the aircraft performance data do not include information related with the aircraft intent, the aircraft intent and the aircraft configuration may be obtained from aircraft intent inference techniques that use as inputs the weather data, the recorded trajectory data of the aircraft, and the nominal aircraft performance model. These aircraft intent inference techniques may be carried out by an engine that is an infrastructure capable of deducting the aircraft intent that corresponds to the flown trajectory by inferring it from the recorded flight data. This model may provide the altitude and speed laws that describe the vertical profile of the trajectory, and a function of the geographic latitude and longitude for determining the lateral profile.

In another embodiment, the comparing stage between the computed trajectory data and the recorded trajectory data may be carried out by comparing target state variables between the recorded trajectory data and the computed trajectory data. For example, the target state variables may be selected among fuel consumption and net thrust.

Once an enhanced APM is obtained, it can be used by any trajectory computation infrastructure. The enhanced APM may be an improved polynomial description of the aircraft performance that provides an improved model of such performance.

The disclosed method may enhance prediction capabilities of aircraft trajectories on-ground (onboard the FMS manages the most up-to-date information about aircraft performance, and therefore, computes the most accurate predications). Various ATM stakeholders may benefit from the disclosed method.

Air Navigation Service Providers may benefit from the disclosed method. Air Navigation Service Providers generally require prediction for efficiently and safely managing the air traffic. They have available to them radar track information and Automatic Dependent Surveillance-Broadcast (ADS-B) information that can be exploited to obtain precise models of real aircraft. The disclosed method may be implemented for generating general models for aircraft of the same type, for the same type and same airline, and even for the same aircraft because the aircraft identificator (ID) can be matched with its performance. This may deliver an increase of current prediction capabilities.

Airlines may benefit from the disclosed method. Airlines use trajectory prediction for optimizing their operations, managing efficiently the whole fleet and planning future operations. The disclosed method may provide a fast procedure for using a realistic representation of the performance of every individual aircraft, while monitoring the degradation in performance. The disclosed method may not replace the current maintenance procedures, but may be a useful mechanism for tracking such behavior.

ATM stakeholders, in general, may benefit from the disclosed method. Due to no other related models are available, the disclosed may enable the capability of introducing the degradation of aircraft performance in any of the tools developed by the stakeholder whose goal is providing reliable hints and suggestions to third parties (e.g., Arrival Managers, Departure Managers, Conflict Detection & Resolution tools, and the like).

The disclosed method may represent the first approach to the problem of modeling the degradation of the aircraft performance to be included in generic polynomial descriptions of such performance. The current systems may not be able to generate highly accurate APMs.

The disclosed method may be applied to airport procedures design, improving the process of validation thanks to accurate tailoring the analysis to the aircraft types and specific airlines to operate in the considered airport.

One example implementation of the disclosed method is disclosed herein with reference to FIG. 1. Starting from an Aircraft Performance Degradation Model (APDM) 1 hypothesis related to the degradation of aircraft performance, a degraded APM 2 may be generated. The APDM 1 may be a nominal aircraft performance model in which the engine performance and airframe performance models have been identified. The APDM 1 may include a polynomial description of the airframe degradation of the aircraft and the polynomial description of engine degradation, and may identify the coefficients of the polynomial descriptions of the drag polar and the engine net thrust models that can represent the performance degradation of the aircraft. The nominal values of such coefficients may be replaced by values that approximate such degradation in the nominal APM of the aircraft. With the new polynomial description of the aircraft performance provided by the APDM 1, a degraded APM 2 may be generated.

The recorded flight data 4 may be private information by the airlines and/or may be public information usually provided by the Air Traffic Control (ATC). This public information may be mainly Automatic Dependent Surveillance-Broadcast information (ADSB). When the recorded flight data 4 is provided by the airlines, this information may have been previously recorded by the Flight Data Recorder System (FDRS) onboard and subsequently downloaded when the aircraft is on ground.

If the recorded flight data 4 come from the airlines and then they have been provided by the Flight Data Recorder System (FDRS) onboard, the recorded flight data 4 may include recorded trajectory data 5, actual weather data 6 faced by the aircraft during flight aircraft configuration 7, information about the aircraft intent 8. Then, the computation process may be straightforward and the recorded flight data 4 may be sent 13 to the trajectory computation infrastructure 3 for calculating the computed trajectory data 10.

If the recorded flight data 4 has been provided by Automated Dependent Surveillance-Broadcast (ADS-B) infrastructure, they may not include information about the aircraft intent 8 or information of the aircraft configuration 7. Then, a process for inferring the aircraft intent 8 and the aircraft configuration 7 may need to be executed. This process may provide the aircraft intent 8 and an aircraft configuration 7 by sending 14 the recorded trajectory data 5 provided by the ADS-B and a numerical prevision weather model to an aircraft intent inference engine 9, wherein the aircraft intent 8 and the aircraft configuration 7 may be obtained. Then, the recorded flight data 4, the weather data 6 provided by the numerical prevision weather model, together with the calculated aircraft intent 8 and the calculated aircraft configuration 7, may be sent 15 to the trajectory computation infrastructure 3.

Independently from the origin of the recorded flight data 4, the degraded APM 2, the weather data 6, the aircraft intent 8, and a plurality of initial conditions may be used for computing the trajectory data 10 of the aircraft by means of a trajectory computation infrastructure 3. Making use of the degraded APM 2, a new computation may be launched in order to compare the computed trajectory data 10 with the recorded trajectory data 5. Then, the computed trajectory data 10 ($TRJ_C$) and the recorded (or real) trajectory data 5 ($TRJ_R$) may be compared.

If the difference 11, in absolute values, of target state variables (e.g., fuel consumption and/or aircraft weight) between the nominal recorded trajectory data 5 and computed trajectory data 10 is negligible, an enhanced APM 12 may be obtained. The difference may be considered negligible when the difference is less than (or equal to) a predefined threshold ($|TRJ_C-TRJ_R|<\epsilon$). If this difference is more than the predefined threshold ($|TRJ_C-TRJ_R|>\epsilon$), an iterative process that implies a modification of the APDM may be followed until the difference meets the defined threshold ($\epsilon$). The enhanced APM 12 may be the final instance of the APM, obtained after an iterative process, which best fits the performance of a real aircraft.

The disclosed method may be executed for each set of Recorded Flight Data available for the same aircraft. The method may ensure that the modeling of aircraft performance gather the most updated information about the considered aircraft. However, from an ATM point of view, this may not be the optimal use of the method. In this environment, it may be more interesting to enhance the models used by ground-based automation tools providing with the APM that statistically best fits the performance of the aircraft of the same type and of the same airline. This may allow "customizing" the trajectory predictions of the aircraft of a specific company, which are supposed to be subject to similar maintenance procedures.

If the disclosed method is used for a fleet of different aircraft of the same family (regardless of the airline), the enhanced APM may represent the average performance of the considered fleet according to environment (aerodrome and standard ATC procedures) in which the predictions capabilities are required.

Thus, the disclosed method may take advantage of an infrastructure capable of representing aircraft trajectories with high fidelity, while introducing a process for improving the description of the aircraft performance required for increasing the accuracy of the trajectory computations.

The description of the different advantageous implementations has been presented for purposes of illustration and description, and is not intended to be exhaustive or limited to the implementations in the form disclosed. Many modifications and variations will be apparent to those of ordinary skill in the art. Further, different advantageous implementations may provide different advantages as compared to other advantageous implementations. The implementation or implementations selected are chosen and described in order to best explain the principles of the implementations, the practical application, and to enable others of ordinary skill in the art to understand the disclosure for various implementations with various modifications as are suited to the particular use contemplated. This written description uses examples to disclose various implementations, which include the best mode, to enable any person skilled in the art to practice those implementations, including making and using any devices or systems and performing any incorporated methods. The patentable scope is defined by the claims, and may include other examples that occur to those skilled in the art. Such other examples are intended to be within the scope of the claims if they have steps/stages that do not differ from the literal language of the claims, or if they include equivalent stages with insubstantial differences from the literal languages of the claims.

What is claimed is:

1. A computer-implemented method for modeling performance of an aircraft through adaptive aircraft performance models using aircraft performance data, the aircraft performance data at least comprising recorded trajectory data of the aircraft, weather data faced during trajectory of the aircraft, aircraft configuration data and an aircraft intent, the method comprising:
    using a nominal aircraft performance model of the aircraft, wherein the nominal aircraft performance model comprises a polynomial description of aircraft performance;
    identifying aircraft degradation coefficients that instantiate engine degradation and airframe degradation in the polynomial description of aircraft performance;
    replacing nominal values of the aircraft degradation coefficients with degraded values that approximate a degradation in aircraft performance to generate a degraded aircraft performance model of the aircraft;
    calculating computed trajectory data based on:
        the aircraft intent, which represents the recorded trajectory data;
        the weather data; and
        the degraded aircraft performance model;
    comparing the recorded trajectory data with the computed trajectory data to obtain a result;
    when the result of the comparison is less than a previously established threshold, obtaining an enhanced aircraft performance model by considering the degraded aircraft performance model as the enhanced aircraft performance model;
    when the result of the comparison is higher than the previously established threshold, modifying the aircraft degradation coefficients and repeating the steps of generating the degraded aircraft performance model and calculating the computed trajectory until the result of the comparison is less than the previously established threshold; and
    modeling the performance of the aircraft utilizing the enhanced aircraft performance model.

2. The method of claim 1 wherein the step of modifying the aircraft degradation coefficients comprises worsening the degraded values to approximate a further degradation in the aircraft performance.

3. The method of claim 2 wherein the aircraft degradation coefficients that instantiate engine degradation and airframe degradation in the polynomial description of aircraft performance are selected among coefficients of drag polar, engine thrust and fuel consumption of the aircraft.

4. The method of claim 1 wherein the step of modifying the aircraft degradation coefficients comprises worsening the degraded values of at least one of a coefficient of drag polar, a coefficient of engine thrust and a coefficient of fuel consumption.

5. The method of claim 1 further comprising obtaining the aircraft intent and the aircraft configuration from onboard the aircraft.

6. The method of claim 1 further comprising obtaining the aircraft intent and the aircraft configuration from a Flight Data Recorder System onboard the aircraft.

7. The method of claim 1 further comprising obtaining the aircraft intent and the aircraft configuration by aircraft intent inference techniques that use as inputs the weather data, the recorded trajectory data of the aircraft, and the nominal aircraft performance model.

8. The method of claim 1 wherein the comparing stage is carried out by comparing target state variables between the recorded trajectory data and the computed trajectory data.

9. The method of claim 8 wherein the target state variables are selected among fuel consumption and net thrust.

10. The method of claim 1 wherein the result is an absolute value of a difference between the recorded trajectory data and the computed trajectory data.

11. The method of claim 1 wherein the computed trajectory data is calculated in a trajectory computation infrastructure using as inputs the aircraft intent that represents the trajectory data, the weather data, and the degraded aircraft performance model.

12. The method of claim 1 further comprising obtaining the weather data from a numerical prevision weather model.

13. The method of claim 1 further comprising, when the result of the comparison is equal to the previously established threshold, obtaining the enhanced aircraft performance model by considering the degraded aircraft performance model as the enhanced aircraft performance model.

* * * * *